US011769538B2

(12) United States Patent
Dodge et al.

(10) Patent No.: US 11,769,538 B2
(45) Date of Patent: Sep. 26, 2023

(54) DECODE CIRCUITRY COUPLED TO A MEMORY ARRAY

(71) Applicant: Micron Technology, Inc., Boise, ID (US)

(72) Inventors: Richard K. Dodge, Santa Clara, CA (US); Timothy C. Langtry, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/550,668

(22) Filed: Dec. 14, 2021

(65) Prior Publication Data

US 2022/0101899 A1 Mar. 31, 2022

Related U.S. Application Data

(62) Division of application No. 16/694,133, filed on Nov. 25, 2019, now Pat. No. 11,205,465, which is a
(Continued)

(51) Int. Cl.
*G11C 8/10* (2006.01)
*G11C 7/10* (2006.01)
*G11C 8/16* (2006.01)
*G11C 5/06* (2006.01)
*G11C 13/00* (2006.01)
(Continued)

(52) U.S. Cl.
CPC ............ *G11C 8/10* (2013.01); *G11C 5/025* (2013.01); *G11C 5/063* (2013.01); *G11C 7/1039* (2013.01); *G11C 7/18* (2013.01); *G11C 8/14* (2013.01); *G11C 8/16* (2013.01); *G11C 13/003* (2013.01); *G11C 13/0026* (2013.01); *G11C 13/0028* (2013.01); *G11C 2213/71* (2013.01)

(58) Field of Classification Search
CPC .. G11C 8/10; G11C 8/14; G11C 5/025; G11C 7/1039; G11C 13/0026; G11C 13/0028; G11C 13/003; G11C 13/0023; G11C 8/16; G11C 7/18; G11C 2213/71; H01L 27/0688
See application file for complete search history.

(56) References Cited

U.S. PATENT DOCUMENTS 7,466,584 B1 12/2008 Parkinson et al.
8,345,472 B2 1/2013 Lee et al.
(Continued)

FOREIGN PATENT DOCUMENTS

CN 102017003 A 4/2011
CN 102971798 B 11/2015
(Continued)

OTHER PUBLICATIONS

Storage Device, Integrated Circuit Device, and Electronic Device (Year: 2016).*
(Continued)

*Primary Examiner* — Sultana Begum
(74) *Attorney, Agent, or Firm* — Brooks, Cameron & Huebsch, PLLC

(57) ABSTRACT

In an example, an apparatus includes a memory array in a first region and decode circuitry in a second region separate from a semiconductor. The decode circuitry is coupled to an access line in the memory array.

20 Claims, 4 Drawing Sheets

Related U.S. Application Data division of application No. 15/689,017, filed on Aug. 29, 2017, now Pat. No. 10,573,362.

(51) Int. Cl.
*G11C 8/14* (2006.01)
*G11C 7/18* (2006.01)
*G11C 5/02* (2006.01)

(56) References Cited

U.S. PATENT DOCUMENTS

| | | |
|---|---|---|
| 8,507,353 B2 | 8/2013 | Oh et al. |
| 8,729,523 B2 | 5/2014 | Pio |
| 8,803,118 B2 | 8/2014 | Redaelli et al. |
| 8,841,649 B2 | 9/2014 | Pio |
| 8,847,186 B2 | 9/2014 | Redaelli et al. |
| 9,117,503 B2 | 8/2015 | Lee et al. |
| 9,166,158 B2 | 10/2015 | Lengade et al. |
| 9,245,926 B2 | 1/2016 | Kau et al. |
| 9,368,205 B2 | 6/2016 | Mantegazza et al. |
| 9,613,689 B1 * | 4/2017 | Takaki ............... G11C 13/0069 |
| 9,679,650 B1 | 6/2017 | Sakui |
| 2007/0019459 A1 | 1/2007 | Yamada |
| 2009/0231899 A1 | 9/2009 | Park |
| 2009/0310402 A1 | 12/2009 | Parkinson |
| 2010/0246234 A1 | 9/2010 | Ahn et al. |
| 2010/0308296 A1 | 12/2010 | Pirovano et al. |
| 2013/0155750 A1 | 6/2013 | Hiroshi |
| 2013/0170283 A1 * | 7/2013 | Lan ..................... G11C 13/003 365/148 |
| 2013/0294152 A1 | 11/2013 | Kau et al. |
| 2014/0217349 A1 | 8/2014 | Hopkins |
| 2014/0254242 A1 | 9/2014 | Siau |
| 2015/0295011 A1 | 10/2015 | Zhang |
| 2016/0027485 A1 | 1/2016 | Park et al. |
| 2017/0025173 A1 | 1/2017 | Chevallier et al. |
| 2017/0117328 A1 | 4/2017 | Terai |
| 2017/0125097 A1 | 5/2017 | Tortorelli et al. |
| 2017/0125484 A1 | 5/2017 | Pellizzer |

FOREIGN PATENT DOCUMENTS

| | | |
|---|---|---|
| EP | 2249348 A2 | 11/2010 |
| JP | 2010-232653 A | 10/2010 |
| JP | 5900672 B2 * | 4/2016 |
| JP | 2017-085103 A | 5/2017 |
| KR | 101622817 B1 | 5/2016 |
| TW | 584852 B | 4/2004 |

OTHER PUBLICATIONS

U.S. Appl. No. 15/482,016 entitled, "Three Dimensional Memory Array," filed Apr. 7, 2017, 43 pp.
International Search Report and Written Opinion from related international application No. PCT/US2018/047134, dated Dec. 14, 2018, 15 pp.
Office Action from related Taiwanese Patent Application No. 107129880, dated Oct. 17, 2019, 15 pages.
Office Action and Search Report from related Taiwanese Patent Application No. 10712988, dated Mar. 10, 2020, 6 pages.
Extended Search Report from related European Patent Application No. 18850119.1, dated Apr. 22, 2021, 10 pages.
Notice of Rejection Ground from related Japanese Patent Application No. 2020-511780, dated May 25, 2021, 15 pages.

* cited by examiner

DECODE CIRCUITRY COUPLED TO A MEMORY ARRAY

PRIORITY INFORMATION

This application is a Divisional of U.S. application Ser. No. 16/694,133, filed on Nov. 25, 2019, which will issue as U.S. Pat. No. 11,205,465 on Dec. 21, 2021, which is a Divisional of U.S. application Ser. No. 15/689,017, filed on Aug. 29, 2017, now issued as U.S. Pat. No. 10,573,362 on Feb. 25, 2020, the contents of which are incorporated herein by reference.

TECHNICAL FIELD

The present disclosure relates generally to memory devices, and, more particularly, to decode circuitry coupled to a memory array.

BACKGROUND

Memory devices may typically be provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), resistance variable memory, and flash memory, among others. Types of resistance variable memory may include phase-change-material (PCM) memory, programmable-conductor memory, and resistive random-access memory (RRAM), among others.

To meet the demand for higher capacity memories, designers continue to strive to increase memory density, such as the number of memory cells in a given area of a base structure (e.g., a base semiconductor, such as a semiconductor substrate, a silicon substrate, etc.), such as a die (e.g., a chip). One way to increase memory density is to form stacked memory arrays (e.g., often referred to as three-dimensional memory arrays). For example, there has been substantial interest in three-dimensional cross-point memory. In some examples, three-dimensional cross-point memory cells may utilize a storage material that may include a phase-change material, a chalcogenide material that may or may not change phase when programmed, etc. as a two-state material suitable for storing a memory bit.

A stacked memory array may include memory cells stacked in a direction perpendicular to the base structure to increase the number of memory cells. In some examples, decode circuitry may be located on and/or in the base structure for accessing the memory cells in a stacked memory array (e.g., in response to addresses).

DETAILED DESCRIPTION

Figure 1:
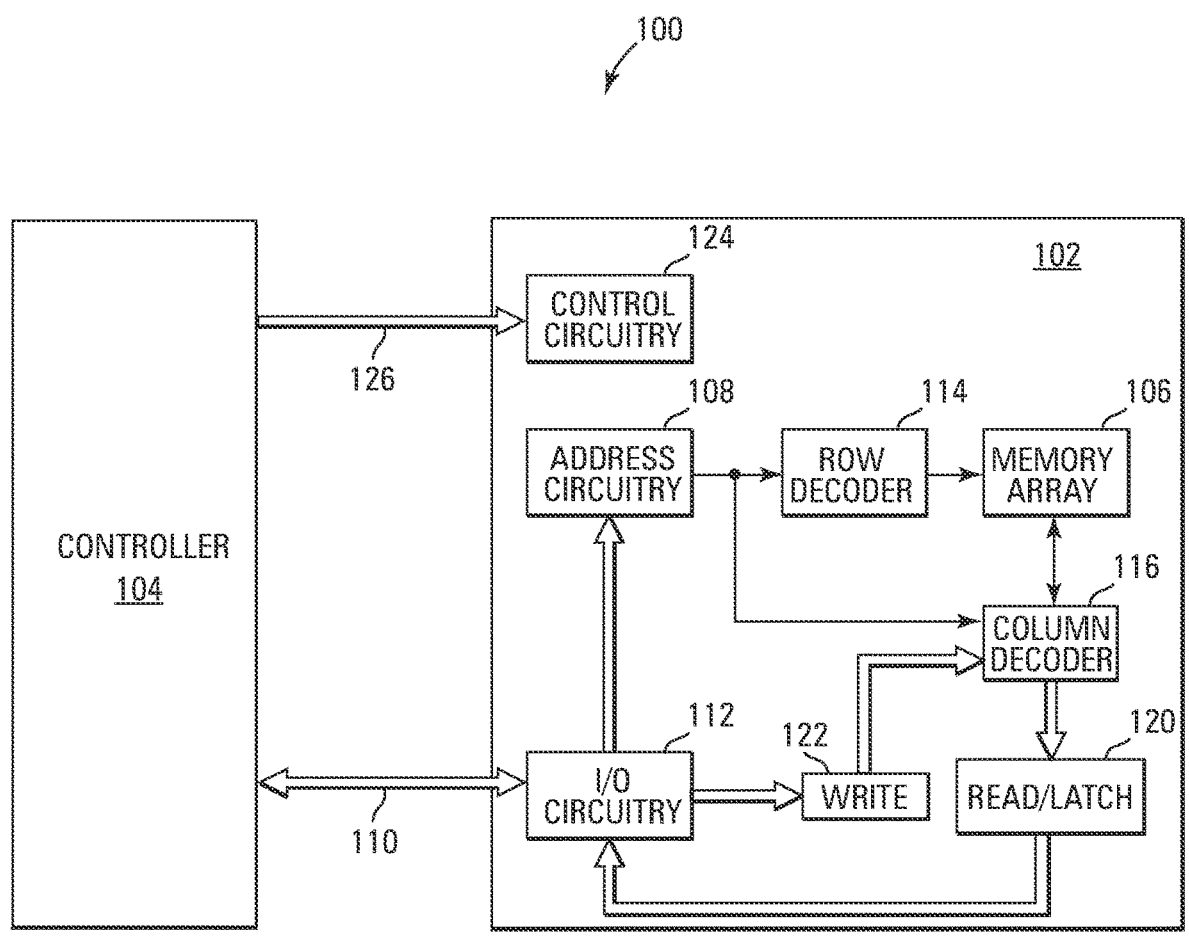
FIG. 1 is a block diagram of an example of an apparatus in accordance with a number of embodiments of the present disclosure.

In an example, an apparatus includes a memory array in a first region and decode circuitry in a second region separate from a semiconductor. The decode circuitry is coupled to an access line in the memory array.

A number of embodiments of the present disclosure provide benefits, such as higher memory cell densities. The number of decks of memory cells in a stack of decks, such as in a three-dimensional (e.g., cross-point) memory array, may, for example, be increased by locating decode circuitry, that otherwise may have been on and/or in a base structure, such as a die, in previous apparatus, separate from the base structure. In some examples, the size of the base structure, and thus die size, may be reduced by locating decode circuitry separate from the base structure and over or under the memory array.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a block diagram of an example of an apparatus, such as an electronic memory system (e.g., a memory) 100, in accordance with a number of embodiments of the present disclosure. For example, memory 100 may be a cross-point memory, such as a three-dimensional cross-point memory. Memory 100 may include a memory device 102 and a controller 104, such as a memory controller. Controller 104 might include a processor, for example. Controller 104 might be coupled to a host, for example, and may receive command signals (or commands), address signals (or addresses), and data signals (or data) from the host and may output data to the host.

Memory device 102 may include a memory array 106 of memory cells. For example, memory array 106 may include one or more of the memory arrays disclosed herein. Memory array 106 may include, for example, a cross-point memory array, such as a stacked (e.g., three-dimensional) cross-point memory array, in accordance with a number of embodiments of the present disclosure. The following discussion is made with reference to a cross-point memory arrays for consistency and simplicity; however, any other array architecture may be used.

Memory device 102 may include address circuitry 108 to latch address signals provided over I/O connections 110 through I/O circuitry 112. Address signals may be received and decoded by a row decoder 114 and a column decoder 116 to access the memory array 106.

Memory device 102 may read data in memory array 106 by sensing voltage and/or current changes in the memory array columns and/or rows using sense/buffer circuitry that in some examples may be read/latch circuitry 120. Read/latch circuitry 120 may read and latch data from the memory array 106. I/O circuitry 112 may be included for bi-directional data communication over the I/O connections 110 with controller 104. Write circuitry 122 may be included to write data to memory array 106.

Control circuitry 124 may decode signals provided by control connections 126 from controller 104. These signals may include chip signals, write enable signals, and address latch signals that are used to control the operations on memory array 106, including data read and data write operations.

Control circuitry 124 may be included in controller 104, for example. Controller 104 may include, other circuitry, firmware, software, or the like, whether alone or in combination. Controller 104 may be an external controller (e.g., in a separate die from the memory array 106, whether wholly or in part) or an internal controller (e.g., included in a same die as the memory array 106). For example, an internal controller might be a state machine or a memory sequencer.

It will be appreciated by those skilled in the art that additional circuitry and signals can be provided, and that memory 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Figure 2A:
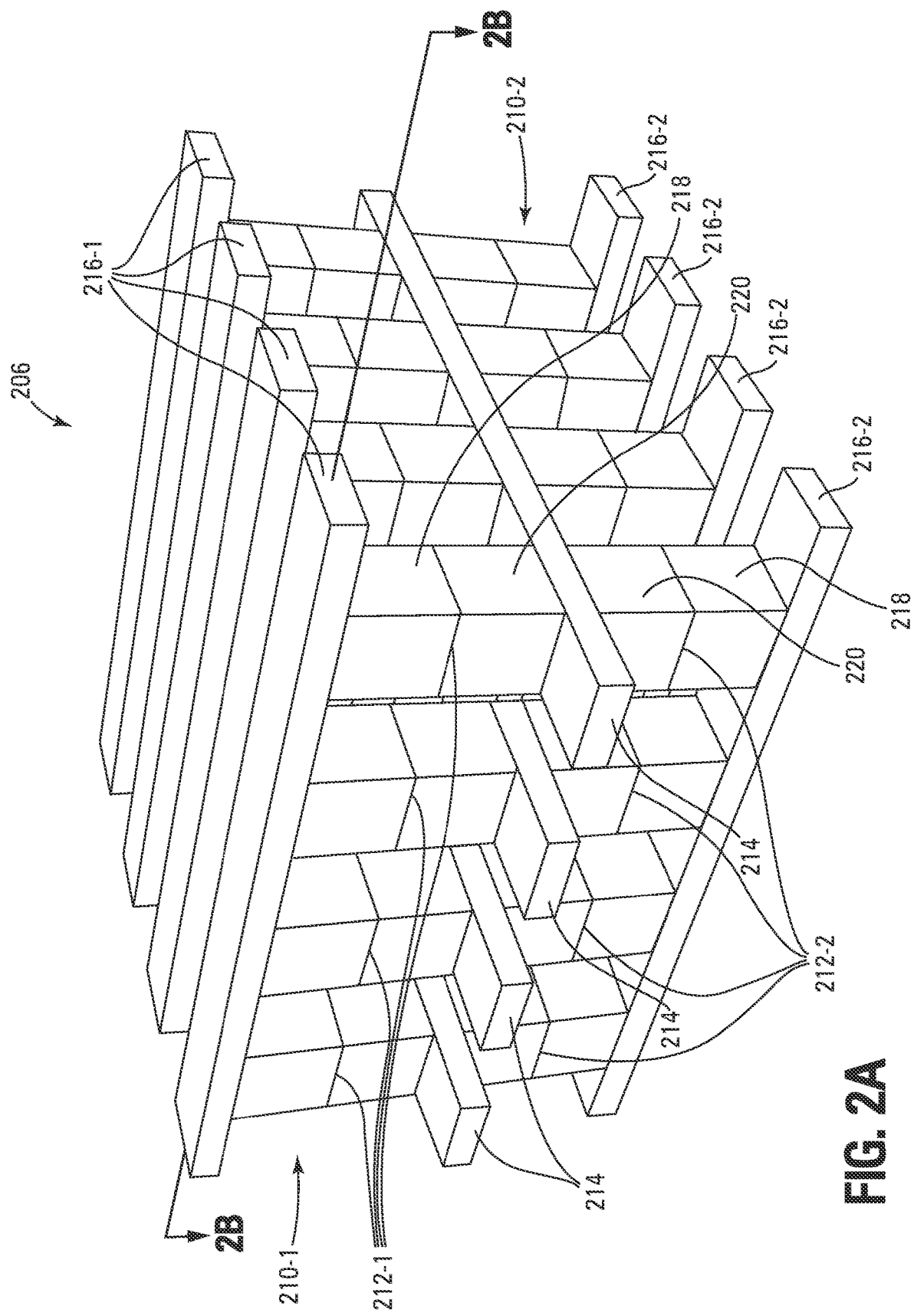
FIG. 2A is a three-dimensional isometric drawing of an example of a portion of a memory array in accordance with a number of embodiments of the present disclosure.

FIG. 2A is a three-dimensional isometric drawing of a portion of a three-dimensional cross-point memory array 206 that may form a portion of memory array 106 in accordance with a number of embodiments of the present disclosure. For example, memory array 206 may include two tiers (e.g., a subarrays) of memory cells, such as a memory array deck 210-1 of memory cells 212-1, stacked over (e.g., above) another tier of memory cells, such as a memory array deck 210-2 of memory cells 212-2.

A memory cell 212-1 (e.g., each of memory cells 212-1) may be between and coupled to an electrode (e.g., an access line) 214 and an electrode (e.g., an access line) 216-1, and a memory cell 212-2 (e.g., each of memory cells 212-2) may be between and coupled to access line 214 and an electrode (e.g., an access line) 216-2. Access lines 214 and 216 may be electrically conductive lines, for example. Although, the access lines 214 and 216 are shown to be orthogonal to each other in the example of FIG. 2A, access lines 214 and 216 are not limited to being orthogonal to each other, and, for example, may form angles other than right angles to each other or may be curvilinear.

An access line (e.g., each of access lines) 214 may be between and commonly coupled to a memory cell 212-1 and a memory cell 212-2. For example, an access line 214 may be common to a memory cell 212-1 and a memory cell 212-2. In some examples, an access line 214 may be data line, such as a bit line, to provide information read from memory cells 212-1 and 212-2 or information to be stored into memory cells 212-1 and 212-2, and an access line 216, such as an access lines 216-1 and 216-2, may be a word line.

In some examples, memory cells 212-1 that are commonly coupled to an access line 214 may be referred to a column of memory cells 212-1, and memory cells 212-2 that are commonly coupled to an access line 214 may be referred to a column of memory cells 212-2. The term "column" does not require any particular orientation or linear relationship, but instead refers to the logical relationship between memory cell and access line 214. In some examples, a row of memory cells 212-1 might be those memory cells 212-1 commonly coupled to an access line 216-1, and a row of memory cells 212-2 might be those memory cells 212-2 commonly coupled to an access line 216-2. For example, a row of memory cells can, but need not, include all memory cells commonly coupled to an access line 216.

The term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

In some examples, a memory cell 212 (e.g., each of memory cells 212-1 and 212-2) may include an access component (e.g., a select device), such as a switch device 218, and a storage element 220 coupled to the switch device 218. A storage element 220 (e.g., the storage element of each of memory cells 212-1 and 212-2) may be to store information. For example, a storage element 220 may be to store a value representing a value of a fraction of a bit, a single bit, or multiple bits. Switch device 218 may be used to access the storage element 220 in the same memory cell.

A storage element 220 may be a resistive element, such as a variable resistive element. For example, a storage element 220 may include a material where at least a portion of the material may be changed (e.g., in a write operation) between different states (e.g., different material phases). The different states may have a range of different resistance values, for example. Different resistance values may be to represent different values of information stored in a memory cell 212.

Switch device 218 may include a material, where at least a portion of the material may be to change (e.g., switch) between a non-conductive state and a conductive state. For example, when one of memory cells 212 is selected in a memory operation, a memory device that may include memory array 206, such as memory device 102, may cause switch device 218 of the selected memory cell 212 to turn on (e.g., change from a non-conductive state to a conductive state). This may allow access to storage element 220 of the selected memory cell 212. In some embodiments, a single self-selecting storage material (not shown) combines the function of the switch device and of the storage element.

A memory cell 212 may be accessed, such as for reading or writing (e.g., programming), by applying a voltage differential across that memory cell 212. For example, a memory cell 212-1 might be accessed by applying a relatively low voltage or a negative voltage to an access line 216-1 and a relatively high voltage or a positive voltage to an access line 214 to create a voltage differential across the memory cell 212-1, and a memory cell 212-2 might be accessed for reading or writing by applying a relatively low voltage or a negative voltage to an access line 216-2 and a relatively high voltage or a positive voltage to an access line 214 to create a voltage differential across the memory cell 212-2.

Storage element 220 may include a variable resistance storage material. For example, storage element 220 may include a chalcogenide material that may be formed of various doped or undoped materials, that may or may not be a phase-change material, and that may or may not undergo a phase change during reading and/or writing the memory cell. In some examples, storage element 220 may include a ternary composition that may include selenium (Se), arsenic (As), and germanium (Ge), a quaternary composition that may include silicon (Si), Se, As, and Ge, etc.

A phase-change material may change between a crystalline state (sometimes referred to as crystalline phase) and an amorphous state (sometimes referred to as amorphous phase). The phase-change material may have one resistance value when it is in the crystalline state and another resistance value when it is in the amorphous state. These different resistance values of the phase-change material may represent different values of information stored in a storage element, such as a storage element 220.

In some examples, a switch device 218 may include a variable resistance material (e.g., phase-change material). However, the material of a switch device 218 may be such that it may operate only as a switch (e.g., not to store information) to allow access to storage element 220. For example, a switch device 218 may include a phase-change material, such as chalcogenide, that may configure a switch device 218 to operate as an ovonic threshold switch (OTS).

An ovonic threshold switch may have a threshold voltage (Vt) such that the ovonic threshold switch may switch from a non-conductive state (e.g., a highly resistive state) to a conductive state (a lower resistive state) when a voltage across it exceeds the Vt. For example, an amount of current may flow through the ovonic threshold switch when it is in the conductive state. When the amount of current reaches a specific value (e.g., a holding current value), the ovonic threshold switch may switch back to the non-conductive state. This switching of the ovonic threshold switch may also happen if the polarities of the voltages across the ovonic threshold switch are changed.

In examples where a switch device 218 might be configured as an ovonic threshold switch, the memory device may cause a voltage differential between two selected lines, such as an access line 214 and an access line 216 (e.g., access line 216-1 or 216-2), coupled to a selected memory cell 212 (e.g., a memory cell 212-1 or 212-2), to have value, such that the ovonic threshold switch formed by switch device 218 of a selected memory cell 212 may switch from a non-conductive state to a conductive state. This may allow access to the selected memory cell.

In other examples, memory cells 212 may be self-selecting, and thus might not include a distinct switch device 218 and a distinct storage element 220. For example, each memory cell 212 may include a material, such as chalcogenide, that may act as a selector material (e.g., a switching material) and a storage material, so that each memory cell 212 may act as both a selector device and a memory element.

Figure 2B:
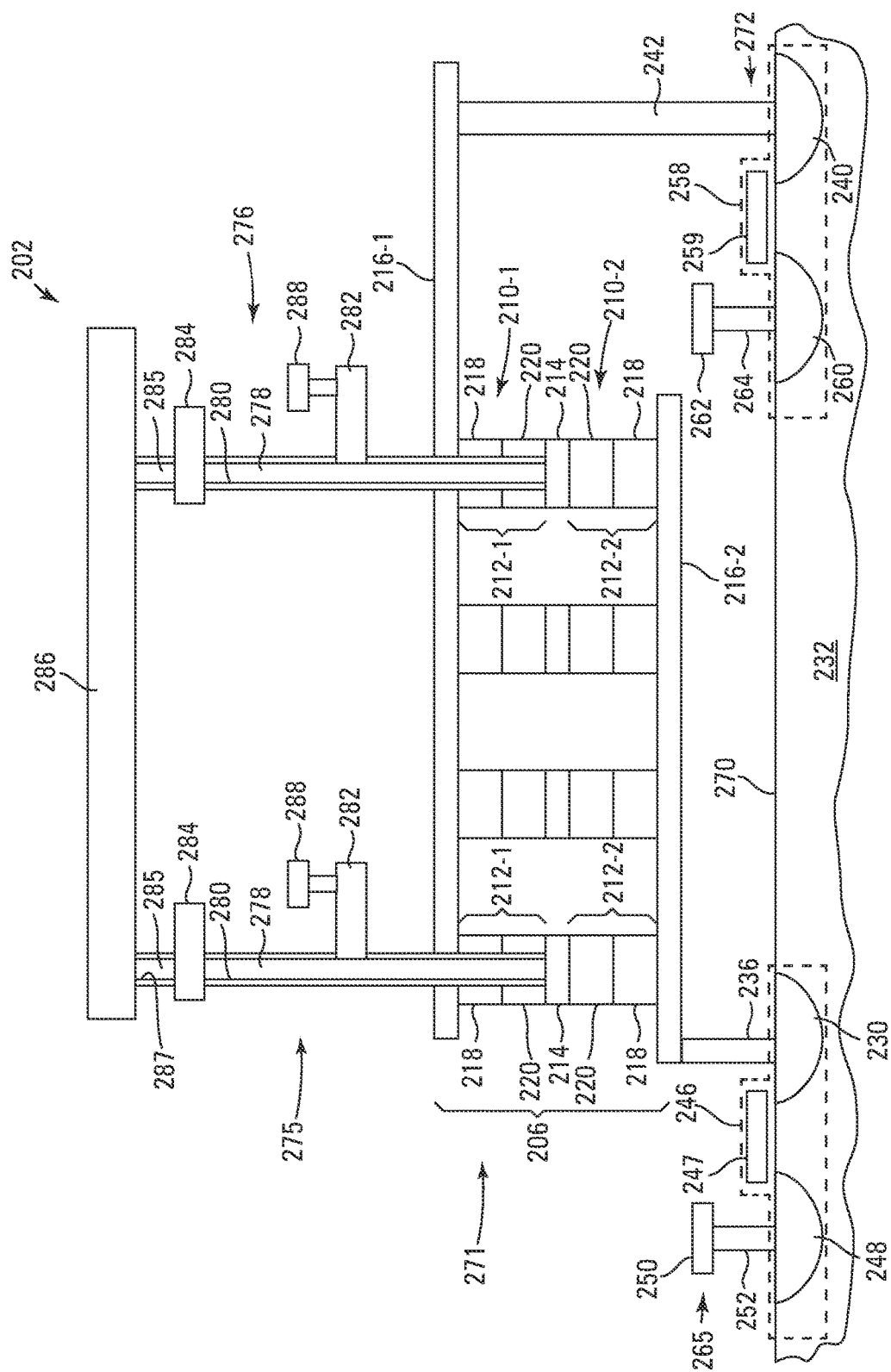
FIG. 2B is a cross-sectional diagram of a portion of an apparatus, in accordance with a number of embodiments of the present disclosure.

FIG. 2B is a cross-sectional diagram of a portion of a memory device 202, such as a portion of a memory device 102, in accordance with a number of embodiments of the present disclosure. In some examples, memory device 202 may include the memory array 206. For example, FIG. 2B shows a cross-section of the memory array 206 taken along the line 2B-2B in FIG. 2A. Instead of the array of FIG. 2A, other array architectures (not shown) may be used, such as three-dimensional multi-tier architectures featuring memory cells in each tier (e.g., at crossing of each layer with vertical pillars). The description will continue by referring to the array described in conjunction with FIG. 2A.

An access line 216-2 may be coupled to a source/drain 230 in a semiconductor 232 by a conductor 236, and an access line 216-1 may be coupled to a source/drain 240 in the semiconductor 232 by a conductor 242. A select transistor 246 may include a gate 247, source/drain 230, and a source/drain 248 in semiconductor 232. For example, source/drain 248 may be coupled to a conductive node 250, such as a select voltage node, by a conductor (e.g., a contact) 252. Node (e.g., a select voltage) 250 may, for example, supply a select voltage, such as a relatively low voltage or a negative voltage to access line 216-2 when select transistor 246 is activated. For example, select transistor 246 may be to selectively couple access line 216-2 to node 250.

A select transistor 258 may include a gate 259, source/drain 240, and a source/drain 260 in semiconductor 232. For example, source/drain 260 may be coupled to a node (e.g., a select voltage node) 262 by a conductor (e.g., a contact) 264. Node 262 may, for example, supply a select voltage, such as a relatively low voltage or a negative voltage to access line 216-1 when select transistor 258 is activated. For example, select transistor 258 may be to selectively couple access line 216-1 to node 262. In some examples, select transistors 246 and 258 may be on and/or in semiconductor 232.

In some examples, nodes 250 and 262 may be in a region 265, such as a metal region (e.g., that may be referred to as a metal 1 region), that may include wiring. Local decode circuitry, such as of row decoder 114, for accessing (e.g., a row of) the memory cells 212-1 commonly coupled to an access line 216-1 and for accessing (e.g., a row of) the memory cells 212-2 commonly coupled to an access line 216-2, and that may include select transistors 246 and 258, may be on and/or in semiconductor 232. The local decode circuitry, for example, may be to selectively couple nodes 250 and 262 respectively to access lines 216-2 and 216-1.

Region 265 may include wiring that may include nodes 250 and 262. Region 265 may be between access line 216-2, and thus memory array 206, and an upper (e.g., a topmost) surface 270 of semiconductor 232, and thus the local decode circuitry on and/or in semiconductor 232. For example, memory array 206 may be above the upper surface 270 of semiconductor 232 and the local decode circuitry on and/or in semiconductor 232. Memory array may be in a region 271, for example.

In some examples, fabrication operations performed on semiconductor 232, such as the formation of isolation regions, conductive wells, transistors (e.g., transistors 246 and 258), and source/drains (e.g., source/drains 230, 240, 248, and 260) may be referred to as frontend-of-line processing. For example, a region 272 including semiconductor 232, source/drains 230, 240, 248, and 260, and transistors 246 and 256 may be formed during frontend-of-line processing and may be referred to as a frontend region.

In previous memory devices, for example, most (e.g., all) of the local decode circuitry, such as of row decoder 114 and of column decoder 116, may have been on and/or in the semiconductor. For example, for some previous memory devices, the decode circuitry for accessing groups (e.g., rows) of memory cells commonly coupled to access lines 216-1 and 216-2 and groups (e.g., columns) of memory cells commonly coupled to access lines 214 may be on and/or in the semiconductor. Moreover, as memory demands increase, the number of memory array decks, such as memory array decks 210, may increase. For example, there may be many more memory array decks than the two memory array decks in memory array 206. As the number of memory array decks increase, so does the amount of decode circuitry on and/or in the semiconductor. This may result in increased semiconductor areas and thus in increased die sizes. For example, the number of memory array decks may be limited to maintain a fixed semiconductor area.

Embodiments of the present disclosure, locate decode circuitry for at least one of the decoders, such as column decoder 116, above the memory array 206. For example, decode circuitry 275, such as of column decoder 116, may be over memory array 206 and located in a region 276. For example, region 271, and thus memory array 206, may be between region 276, and thus decode circuitry 275, and region 272, and thus semiconductor 232 and the decode circuitry that may be on and/or in semiconductor 232. Region 271 may be between region 276 and region 265, for example.

Locating decode circuitry 275 in region 276 above the memory array 206, instead of in region 272 may allow for increased memory cell densities. For example, more decks may be added without appreciably increasing the size of the semiconductor. In some examples, locating the decode circuitry 275 above the memory array 206 while keeping the number of decks fixed may allow the for a decrease in the size of semiconductor 232, in that decode circuitry that may have otherwise been in region 272, and thus on and/or the semiconductor, in previous memory devices may now be located above the memory array.

In the example of FIG. 2B, a region including the region 265, region 271, and thus memory array 206, and region 276, and thus decode circuitry 275, may, for example, be referred to as a backend region. The backend region may be formed after the region 272, formed during frontend processing, and may be formed during what may be referred to as backend-of-line processing. For example, regions 265, 271, and 275 may be formed during backend-of-line processing. In some examples, contacts (e.g., contacts 252 and 264) and nodes 250 may be included in the region 265, and thus may be formed during backend processing. Decode circuitry 275 may be for memory array 206, such as for accessing groups of memory cells 212-1 and 212-2 commonly coupled to each of the access lines 214. For example, conductors 278, such as vias, formed in openings 280 in a dielectric, may couple decode circuitry 275 to corresponding ones of access lines 214.

Although the example of FIG. 2B illustrates conductors 278 and openings 280 in the cross-section of FIG. 2B and passing through access line 216-1, conductors 278 and openings may be formed in a different plane and not pass through access line 216-1. For example, access lines 214 may extend to another plane parallel to the face plane of FIG. 2B and beyond access lines 216-1 and 216-2, where they would be contacted by conductors 278. Although FIG. 2B shows decode circuitry 275 being coupled to only two access lines 214 for simplicity, decode circuitry 275 may be coupled to each of the access lines 214.

A conductor 278, for example, may couple a corresponding trigger device 282 of decode circuitry 275, such as a diode (e.g., polysilicon thin film diode, amorphous silicon thin film diode, epitaxial diode, etc.) or a transistor (e.g., polysilicon thin film transistor, amorphous silicon thin film transistor, epitaxial transistor, etc.), to a corresponding select device, such as a switch device 284, of decode circuitry 275. For example, a conductor 278 may couple a corresponding switch device 284 and a corresponding trigger device 282 to a corresponding one of access lines 214.

A switch device 284, for example, may be as described above for a switch device 218. For example, switch device 284 may be an OTS and may include a voltage-switching material, such as chalcogenide.

A conductor 285, such as a via, formed in an opening 287 in a dielectric, may couple the switch device 284 to a global decode node 286 that may be coupled to read/write circuitry, such as for supplying read/write voltages. Switch device 284 may, for example, be to selectively couple global decode node 286 to the corresponding access line 214. For example, when switch device 284 is activated, global decode node 286 may be coupled to the corresponding access line 214. Note, for example, that trigger devices 282, switch devices 284, and global decode node 286 may be formed during backend-of-line processing.

A trigger device 282 (e.g., each of trigger devices 282) may be coupled to a pre-decoder (e.g., that may be in or on semiconductor 232) by a conductive line 288. For example, the pre-decoder may decode addresses and may send a control signal to a trigger device 282 coupled to an access line 214 corresponding to that address to select (e.g., activate) the trigger device 282, and thus select the access line 214.

In some examples, activating a trigger device 282 may cause trigger device 282 to activate a corresponding switch device 284. For example, an activated trigger device 282 may act to cause a threshold current to flow through the switch device 284 that may activate the switch device 284. Activated switch device 284 may cause a voltage (e.g., a relatively high voltage or a positive voltage) on global decode node 286 to be applied to the corresponding access line 214 that may be coupled to a target memory cell, such as one of a pair of memory cells 212-1 and 212-2.

Meanwhile, a voltage (e.g., a relatively low voltage or a negative voltage) may be provided from node 250 to an access line 216-2 to select the target memory cell 212-2 of the pair of memory cells 212-1 and 212-2 coupled to the access line 214, or from node 262 to an access line 216-1 to select the target memory cell 212-1 of the pair of memory cells 212-1 and 212-2 coupled to the access line 214. For example, the voltage difference between access line 214 and the access line 216-1 may cause the switch device 218 of the target memory cell 212-1 to select memory cell 212-1, or the voltage difference between access line 214 and the access line 216-2 may cause the switch device 218 of the target memory cell 212-2 to select memory cell 212-2.

Although the example of FIG. 2B illustrates region 276, and thus decode circuitry 275, being over (e.g., above) region 271, and thus memory array 206, in some examples, region 276 may be below memory array 206. For example, region 276, and thus decode circuitry 275, may be between region 265 and region 271, and may still be formed in the backend region during backend processing. For example, the decoder circuitry 275 may be formed during backend processing before forming memory array 206 and may, for example, reduce the amount of processing after forming the memory array. For example, region 276 may be separate from (e.g., not in or on) the semiconductor so as not to increase the size of the semiconductor.

Trigger devices 282 and switch devices 284 may be formed below memory array 206 and may be coupled to each other in a manner similar to that shown in FIG. 2B. Each of the respective trigger devices 282 and switch devices 284 may then be coupled to each respective access line 214 by a conductor. Each switch device 284 may be coupled to a global decode node 286 by a conductor, where global decode node 286 may be located above or below region 271, for example. For example, trigger devices 282 and switch devices 284 may be may be separate from the semiconductor.

Figure 3:
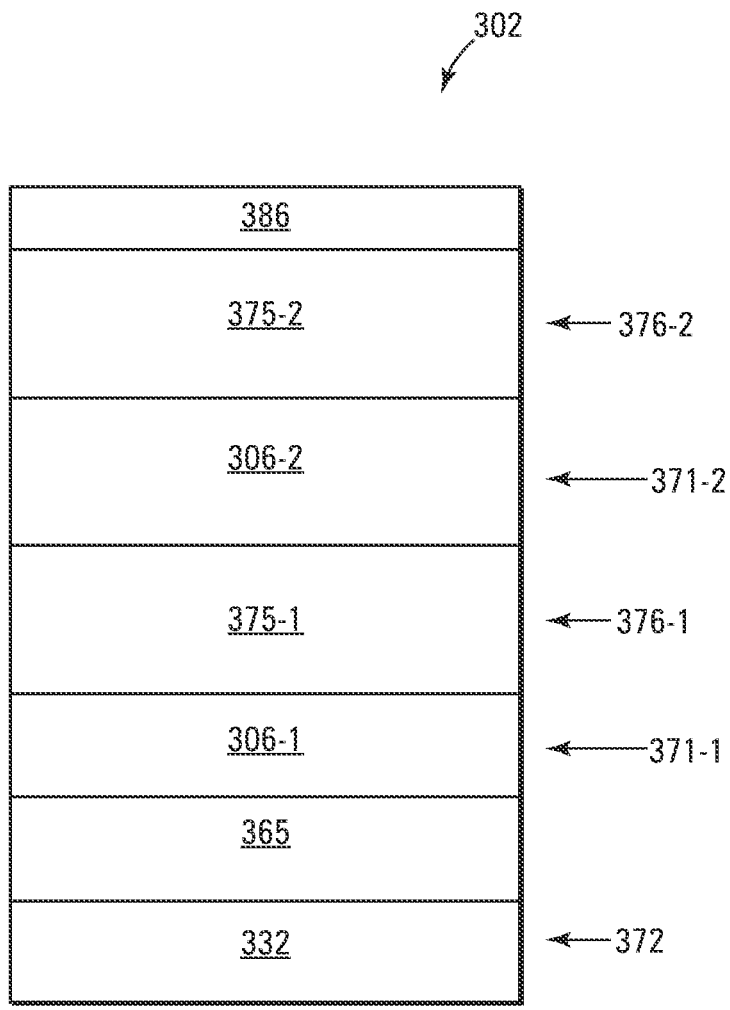
FIG. 3 is a block diagram of another example of an apparatus in accordance with a number of embodiments of the present disclosure.

FIG. 3 is a block diagram of a portion of a memory device 302 that may be a portion of memory device 102. For example, memory device 302 may include a region 372 that may be similar to (e.g., the same as) region 272 and may include a semiconductor 332 that may be similar to (e.g., the same as) semiconductor 232, as described above. A region 365, that may be similar to (e.g., the same as) region 265, as described above, may be over semiconductor 232. A region 371-1 may be over region 365 and may be similar to (e.g., the same as) region 271 and may include memory array 306-1 that may be similar to (e.g., the same as) as memory array 206, as described above. A region 376-1 may be over region 371-1 and may be similar to (e.g., the same as) region 276 and may include decoder 375-1 that may be similar to (e.g., the same as) decoder 275, as described above. A region 371-2 may be over region 376-1 and may be similar to (e.g., the same as) region 271 and may include memory array 306-2 that may be similar to (e.g., the same as) as memory array 206, as described above. For example, memory arrays 306-1 and 306-2 may include multiple decks of memory cells, such as memory array decks 210-1 and 210-2, as described above in conjunction with FIGS. 2A and 2B. A region 376-2 may be over region 371-2 and may be similar to (e.g., the same as) region 276 and may include decoder 375-2 that may be similar to (e.g., the same as) decoder 275, as described above. A global access node 386, that may be similar to (e.g., the same as) as global access node 286, may be over region 376-2.

In some examples, decoder circuitry in region 372 that may be on and/or in the semiconductor 332 may be to selectively couple select voltage nodes in region 365 to access lines in memory arrays 306-1 and 306-2 that, for example, may be commonly coupled to rows of memory cells in memory arrays 306-1 and 306-2, such as in a manner similar to (e.g., the same as) decoder circuitry in region 272 on and/or in the semiconductor 232 being to selectively respectively couple select voltage nodes 250 and 262 in region 265 to access lines 216-2 and 216-1, as described above. For example, select transistors in region 372 that may be on and/or in the semiconductor 332 may be between and coupled to the select voltage nodes in region 365 and the access lines in memory arrays 306-1 and 306-2 that, for example, may be commonly coupled to rows of memory cells.

Decoder 375-1 may be to selectively couple global access node 386 to access lines of memory array 306-1 that may, for example, be commonly coupled to columns of memory cells of memory array 306-1 in a manner similar to (e.g., the same as) decoder 275 being to selectively couple global access line 286 to access lines 214, as described above. Decoder 375-2 may be to selectively couple global access node 386 to access lines of memory array 306-2 that may, for example, be commonly coupled to columns of memory cells of memory array 306-2 in a manner similar to (e.g., the same as) decoder 275 being to selectively couple global access line 286 to access lines 214, as described above. For example, decoders 375-1 and 375-2 may each include trigger devices, such as the trigger devices 282 described above, and switch devices, such as the switch devices 284, described above, where a trigger device and a switch device of decoder 375-1 may be between and coupled to global access node 386 and an access line in memory array 306-1 that may, for example, be commonly coupled to columns of memory cells of memory array 306-1. A trigger device of decoder 375-2 may be coupled to a switch device of decoder 375-2, and the trigger device and the switch device of decoder 375-2 may be between and coupled to global access node 386 and an access line in memory array 306-2 that may, for example, be commonly coupled to columns of memory cells of memory array 306-2.

In some examples, region 371-1, and thus memory array 306-1, may be over region 376-1, and thus decoder 375-1, so that region 376-1 may be between region 371-1 and region 365, and/or region 371-2, and thus memory array 306-2, may be over region 376-2, and thus decoder 375-2, so that region 371-2 may be between region 376-2 and global access node 386. In some examples, global access node 386 may be under regions 371-1, 376-1, 371-2, and 376-2 (e.g., above or a part of region 365)

Note, for example, that the decoders 375 that may have otherwise been in region 372 and on and/or in the semiconductor 332 in previous memory devices may be separate from the semiconductor and now in regions 376-1 and 376-2 that may be above or below their corresponding memory arrays. For example, region 365, such as a metal region (e.g., a wiring region), may be between the semiconductor and the region 376-1 and/or the region 371-1. Therefore, the decoders might not contribute to the size of the semiconductor, as may occur in previous memory devices.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method, comprising:
   forming a memory array in a first region;
   forming a conductor coupled to an access line of the memory array;
   forming a trigger device in a second region and coupled to the conductor; and
   forming a switch device in the second region and coupled to the conductor, wherein the trigger device and the switch device are configured to couple the memory array to a global decode node via the conductor;
   activating the trigger device to decode an address line and activate the switch device utilizing a threshold current.

2. The method of claim 1, further comprising forming the global decode node coupled to the switch device such that the second region is between the first region and the global decode node.

3. The method of claim 1, further comprising forming the trigger device and the select device during backend-of-line processing.

4. The method of claim 1, wherein the access line is a first access line, and wherein forming the memory array further comprises:
   forming a first memory cell coupled to a second access line;
   forming the first access line coupled to the first memory cell such that the first memory cell is between the first and second access lines;

forming a second memory cell coupled to the first access line such that the first access line is between the first and second memory cells; and forming a third access line coupled to the second memory cell such that the second memory cell is between the first and third access lines.

5. An apparatus, comprising:
a memory array formed in a first region of a memory device;
a conductor coupled to an access line of the memory array;
a trigger device formed in a second region of the memory device and coupled to the access line of the memory array; and
a switch device formed in the second region and coupled to the access line, wherein the trigger device and the switch device are configured to couple the memory array to a global decode node via the conductor;
activating the trigger device to decode an address line and activate the switch device utilizing a threshold current.

6. The apparatus of claim 5, wherein the memory array comprises a memory cell coupled to the access line.

7. The apparatus of claim 5, further comprising:
an additional memory array formed on the memory array;
an additional trigger device formed on the additional memory array; and
an additional select device formed on the additional memory array.

8. The apparatus of claim 5, wherein the switch device is a first switch device,
wherein the access line is a first access line, and
wherein the apparatus further comprises:
a first select transistor formed in a semiconductor material and configured to selectively couple a second access line to a first node; and
a second select transistor formed in the semiconductor material and configured to selectively couple the second access line of the memory array to a second node.

9. The apparatus of claim 5, wherein the switch device comprises a voltage- switching material.

10. The apparatus of claim 5, wherein the switch device comprises a chalcogenide material.

11. The apparatus of claim 5, wherein the switch device comprises an ovonic threshold switch.

12. The apparatus of claim 5, wherein the trigger device comprises a diode or a transistor.

13. The apparatus of claim 5, wherein the trigger device is configured to, responsive to application of a signal, activate the switch device.

14. The apparatus of claim 5, wherein the switch device is configured to couple the access line to a global decode node of the memory device.

15. A memory device, comprising:
a first region comprising:
a memory cell of a memory array;
a first switch device configured to selectively couple the memory cell to an access line, wherein the access line is coupled to a conductor; and
a second region formed on the first region and comprising:
a trigger device; and
a second switch device coupled to the trigger device and configured to selectively couple the access line to a global decode node, wherein the trigger device and the second switch device are configured to couple the memory array to a global decode node via the conductor;
activating the trigger device to decode an address line and activate the second switch device utilizing a threshold current.

16. The memory device of claim 15, wherein the first region is formed in contact with a semiconductor material, and wherein the second region is formed on the first region and physically separate from the semiconductor material.

17. The memory device of claim 15, further comprising a select transistor formed at least partially in the semiconductor material and coupled to the access line.

18. The memory device of claim 15, wherein the trigger device is configured to cause the second switch device to transition between a non-conductive state and a conductive state.

19. The memory device of claim 15, wherein a state of the first switch device is not affected by activation of the trigger device.

20. The memory device of claim 15, wherein the first and second switch devices comprise a same switch material.

* * * * *